United States Patent [19]

Kobayashi

[11] Patent Number: 4,789,095

[45] Date of Patent: Dec. 6, 1988

[54] METHOD OF CONTROLLING A WIRE BONDING APPARATUS

[75] Inventor: Hiroaki Kobayashi, Yokohama, Japan

[73] Assignee: Kabushiki Kaisha Toshiba, Kawasaki, Japan

[21] Appl. No.: 150,310

[22] Filed: Jan. 29, 1988

[30] Foreign Application Priority Data

Feb. 9, 1987 [JP] Japan .................................. 62-27659

[51] Int. Cl.⁴ ............................................. B23K 20/10
[52] U.S. Cl. .................................... 228/102; 228/110; 228/179; 228/180.2; 228/1.1; 228/4.5; 219/56.21; 219/56.22
[58] Field of Search .............. 228/102, 110, 111, 179, 228/180.2, 1.1, 4.5; 219/56.21, 56.22

[56] References Cited

U.S. PATENT DOCUMENTS

| 4,444,349 | 4/1984 | Bilane et al. | 228/102 |
| 4,571,688 | 2/1986 | Kashihara et al. | 228/102 |
| 4,597,519 | 7/1986 | Kurtz et al. | 228/179 |
| 4,603,802 | 8/1986 | Kurtz et al. | 228/110 |
| 4,653,681 | 3/1987 | Dreilbelbis et al. | 228/4.5 |

Primary Examiner—Nicholas P. Godici
Assistant Examiner—Samuel M. Heinrich
Attorney, Agent, or Firm—Foley & Lardner, Schwartz, Jeffery, Schwaab, Mack, Blumenthal & Evans

[57] ABSTRACT

There is provided a method of controlling a wire bonding apparatus comprising a main arm fluctuated by a drive motor, a sub-arm coupled to the main arm by a coupling force given by a coupling motor, a bonding tool attached to the sub-arm, and ultrasonic wave application means for applying ultrasonic wave to the bonding tool while allowing one end of a wire held by the bonding tool to be in contact with a joining portion of a semiconductor chip to thereby join the wire to the joining portion. This control method is characterized in that the main arm and sub-arm are coupled by a first coupling force given by the coupling motor for a time period during which the one end of the wire is not in contact with the joining portion of the semiconductor chip, that the main arm and the sub-arm are coupled by a second coupling force given by the coupling motor for a time period during which the one end of the wire is in contact with the joining portion of the semiconductor chip and ultrasonic wave is not applied to the bonding tool, and that the main arm and the sub-arm are coupled by a third coupling force given by the coupling motor for a time period during which the one end of the wire is in contact with the joining portion of the semiconductor chip and ultrasonic wave is applied to the bonding tool.

16 Claims, 3 Drawing Sheets

METHOD OF CONTROLLING A WIRE BONDING APPARATUS

BACKGROUND OF THE INVENTION

This invention relates to a method of controlling a wire bonding apparatus used in a step for assembling a semiconductor device.

For a wire bonding apparatus used for connecting bonding pads of a semiconductor chip and inner leads using bonding wires, apparatus of the type which joins or connects wires using ultrasonic wave are generally used. In such bonding apparatus using ultrasonic wave, the optimum conditions of pressure application time and/or pressure force of the ultrasonic wave vary depending upon the form or configuration, material or the like of the wire or the joining portion.

When joining is implemented using hard wires such as Cu wires, a large pressure force of 100 to 200 g is required. When joining is implemented to a broad joining portion using thick wires, a large pressure force of 100 to 200 g is also required. On the contrary, when joining is implemented to a small joining portion in order to carry out high density wiring, it is required to reduce a pressure force applied to the joining portion.

When an attention is made to the optimum condition for ultrasonic wave bonding in the wire bonding apparatus, it is required to take into consideration the area of the wire tip portion joined to the joining portion. This is because whether or not the condition for ultrasonic bonding is optimum is not determined by the entire energy applied to the joining portion by ultrasonic wave, but by the energy per unit area. Accordingly, if the joining area of the wire tip portion is too small, the energy per unit area becomes too large, with the result that bonding pads of semiconductor elements to be joined are damaged.

On the contrary, if the joining area of the wire tip portion is too large, the energy per unit area becomes too small, resulting in insufficient joining strength. In this case, if the ultrasonic energy is raised for the reason why the joining strength is insufficient, the tip portion of the wire is collapsed or destroyed to become too large, thus being in contact with a wire close thereto.

However, in the conventional wire bonding apparatus, the pressure force applied is fixed from the time when the bonding tool is positioned away from the joining surface by a distance greater than a fixed distance required until it reaches the joining surface to the time when the bonding tool is raised to the position away from the joining surface by more than fixed distance after joining or bonding has been completed. For this reason, if the tip portion of the wire varies in dimension, the pressure energy applied per unit area changes, resulting in the problem that the bonding cannot be necessarily conducted in the optimum condition at all times.

Where the pressure force required is large, it is possible to increase a speed for moving the bonding tool in upper and lower directions. However, where the pressure force required is small, there occurs the problem that the bonding tool vibrates when an attempt is made to move it in upper and lower directions at a high speed. For this reason, the bonding tool must be moved at a low speed when the pressure force is small, leading to the problem that it takes much time for bonding.

In addition, where joining is implemented by a large pressure force, there is the possibility that a large impact is given to the semiconductor chip to damage it, resulting in the problem that the tip portion of the wire is collapsed or destroyed.

SUMMARY OF THE INVENTION

An object of this invention is to provide a method of controlling a wire bonding apparatus which is capable of arbitrarily setting an area of the joining portion that the tip portion of the wire contacts at the beginning of the ultrasonic wave bonding.

Another object of this invention is to provide a method of controlling a wire bonding apparatus which is capable of stably moving the bonding tool in upper and lower directions without vibrating it even when joining is implemented by a low pressure force.

A further object of this invention is to provide a method of controlling a wire bonding apparatus which can relax an impact when joining is implemented by a large pressure force.

The above-mentioned object is accomplished by a method of controlling a wire bonding apparatus comprising a drive motor, a main arm fluctuated by the drive motor, a sub-arm coupled to the main arm by coupling force given by a coupling motor, a bonding tool attached to the subarm, and ultrasonic wave application means for applying ultrasonic wave to the bonding tool, thus to apply ultrasonic wave to the bonding tool while bringing one end of a wire held by the bonding tool into contact with a joining portion of a semiconductor chip to thereby join the wire to the joining portion, characterized in that the main arm and the sub-arm are coupled by a first coupling force given by the coupling motor for a time period during which the one end of the wire is not in contact with the joining portion of the semiconductor chip, that the main arm and the sub-arm are coupled by a second coupling force given by the coupling motor for a time period during which the one end of the wire is in contact with the joining portion of the semiconductor chip and ultrasonic wave is not applied to the bonding tool, and that the main arm and the sub-arm are coupled by a third coupling force given by the coupling motor for a time period during which the one end of the wire is in contact with the joining portion of the semiconductor chip and ultrasonic wave is applied to the bonding tool.

As constituted above, this invention can advantageously carry out joining suitable for wide variety of joining conditions for various kinds without lowering producibility. Further, this invention can advantageously conduct joining under condition of ultra-low pressure force or ultra-high pressure force where the conventional method cannot be applied because the operation under such a condition is out of the stable operation range. This can open a way to mass production for new semiconductor devices or components. In addition, joining can be implemented under condition optimally set, resulting in the advantage that high quality and high yield wire bonding can be conducted.

DETAILED DESCRIPTION OF THE INVENTION

A wire bonding apparatus controlled by a method according to this invention will be described.

Figure 1:
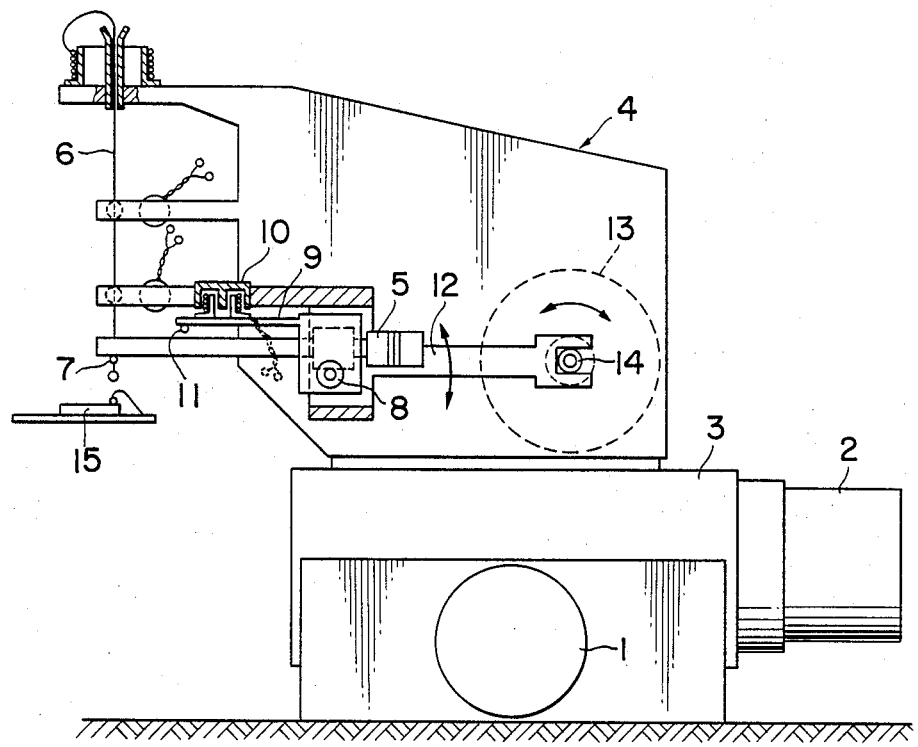
FIG. 1 is a side view showing the entirety of a wire bonding apparatus.
Figure 2:
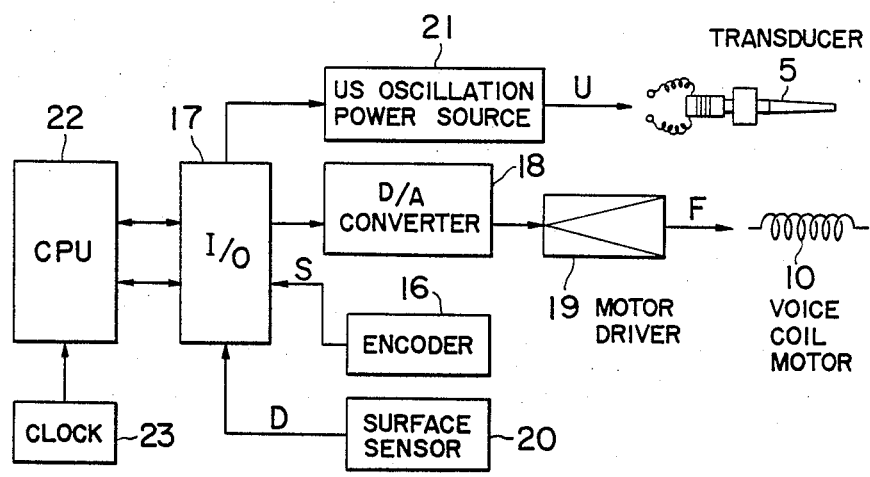
FIG. 2 is a block diagram showing a control system for the wire bonding apparatus.

A wire bonding apparatus by ultrasonic wave is shown in FIGS. 1 and 2.

In the wire bonding apparatus, on the upper surface of an X-Y table 3 controlled by an X-direction drive motor 1 and a Y-direction drive motor 2, a bonding head unit 4 is mounted. This bonding head unit 4 is provided with an ultrasonic wave transducer 5. To the tip portion of the ultrasonic transducer 5, a bonding tool 7 through which a bonding wire 6 is fitted is attached. The transducer 5 is attached to an auxiliary or subfluctuation arm 9 fluctuating with a pivotal axis 8 being as rotation center. The sub-fluctuation arm 9 to which the transducer 5 is attached is coupled to a fluctuation arm 12 by a voice coil motor 10 as a coupling motor and a lock pin 11 to fluctuate in cooperation therewith. The coupling force between the subfluctuation arm 9 and the fluctuation arm 12 is determined by a thrust or driving force of the voice coil motor 10. The rear or back end of the fluctuation arm 12 is connected or coupled to an arm drive motor 13 for giving fluctuation thereto through an eccentric shaft 14. By allowing the fluctuation arm 12 to fluctuate, the upper and lower movements of the transducer 5 and the bonding tool 7 are controlled. In addition, by the thrust or driving force of the voice coil motor 10, the pressure force applied to the bonding tool 7 is controlled.

A control system for the wire bonding apparatus is shown in FIG. 2. The program for control of the wire bonding apparatus is executed by a CPU (Central Processing Unit) 22. The execution of the program is performed in synchronism with a clock signal from a clock 23. To the CPU 22, an input/output interface 17 is connected.

To the input/output interface 17, the transducer 5 is connected through a US oscillation power source 21. By ultrasonic wave U output from the US oscillation power source 21, the transducer 5 is driven.

Further, to the input/output interface 17, the voice coil motor as coupling motor is connected through a D/A converter 18 and a motor driver 19. A digital signal for driving the voice coil motor 10 from the input/output interface 17 is converted to an analog signal by the D/A converter 18. The analog signal thus obtained is applied to the voice coil motor 10 as a thrust or driving force signal F.

To the input/output interface 17, an encoder 16 directly coupled to the arm drive motor 13 is connected. By a position signal S from the encoder 16 of the arm drive motor 13, the positions in upper and lower movements of the bonding tool 7 can be recognized.

To the input/output interface 17, a surface sensor 20 for sensing that the bonding tool 7 has reached the joining surface is connected. From the surface sensor 20, a sense signal D is output.

Prior to the description of a method of controlling a wire bonding apparatus according to this invention, a conventional control method will be explained with reference to FIG. 3 for better understanding of this invention.

Figure 3:
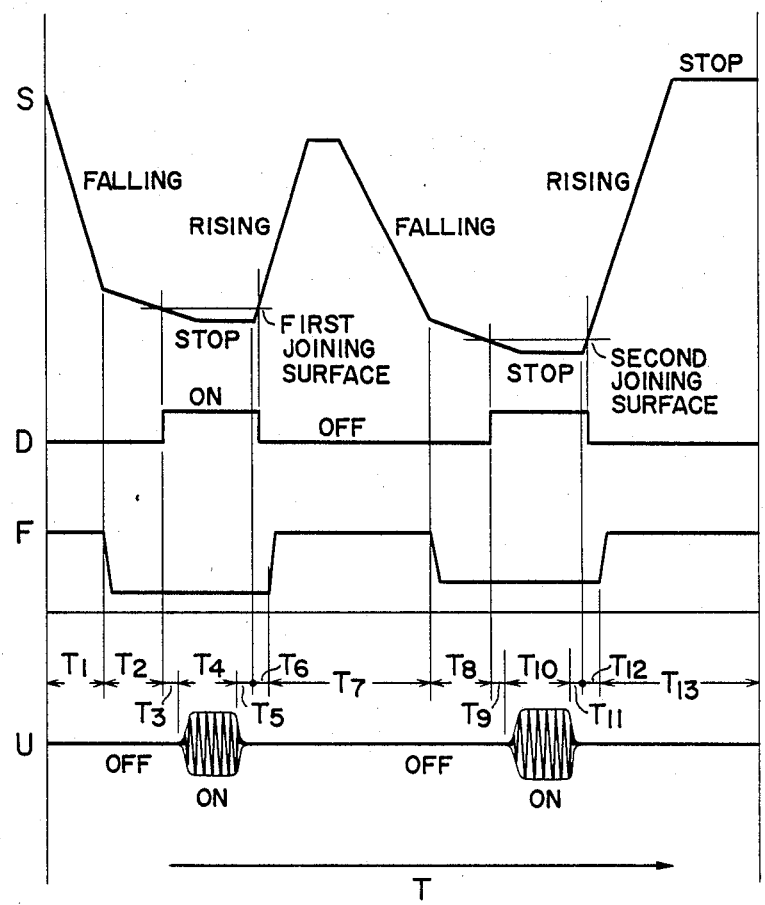
FIG. 3 is a time chart showing a method of controlling a conventional wire bonding apparatus.

The bonding tool 7 moves upwardly and downwardly as shown by the position signal S in FIG. 3. Namely, every time bonding is implemented to a single wire, two upper and lower movements (fluctuations) are conducted. Namely, two bondings of a first bonding for joining the wire to the bonding pad of the semiconductor chip and a second bonding for joining the wire to the inner lead are carried out. The thrust or driving force F of the voice coil motor 10 is subjected to a control such that it is switched into large and small driving forces as shown in FIG. 2. This driving force F has two functions. First, the driving force F functions as a pressure force for forcing or pressing the bonding tool 7 onto the joining surface of the semiconductor chip 15. Second, the driving force functions as a force for pressing the subfluctuation arm 9 onto the lock pin 11 adjoining the fluctuation arm 12 so that the sub-fluctuation arm 9 stably follows the upper and lower movements of the fluctuation arm 12.

The driving force F represents a large value at time periods $T_1$, $T_7$ and $T_{13}$ during high speed upper and lower movements. Thus, the sub-fluctuation arm 9 is forced or pressed by a strong force, so that the sub-fluctuation arm 9 follows the high speed upper and lower movements of the fluctuation arm 12. The driving force F represents a small value at time periods $T_2$ to $T_6$ and $T_8$ to $T_{12}$ at the time of bonding. During the first bonding, at time periods $T_2$ to $T_6$, a pressure force necessary for optimum joining is exerted on the bonding tool 7 under the first bonding condition. During the second bonding, at time periods $T_8$ to $T_{12}$, a pressure force necessary for optimum joining is exerted on the bonding tool 7 under the second bonding condition.

It is to be noted that the time periods $T_2$ and $T_8$ are an approach period during which the movement speed of the bonding tool 7 is caused to be low, thus to relax the impact applied during the bonding.

In the above-mentioned conventional wire bonding apparatus, during time periods $T_2$ to $T_6$ from the approach time at which bonding tool has not reached the joining surface to the time when the bonding tool 7 is raised to some extent after bonding or joining, the driving force F is fixed to a constant value.

Since the driving force F is large during the time periods $T_1$, $T_7$ and $T_{13}$ at which the bonding tool 7 moves upwardly and downwardly at a high speed, the bonding tool 7 operates in a stabilized manner, resulting in no possibility that it vibrates. However, where the driving force F is small, e.g., in the case of bonding period, at the approach periods $T_2$ and $T_8$ or at the time when the bonding tool starts, the sub-fluctuation arm 9 fails to follow the high speed upper and lower movements of the fluctuation arm 12, resulting in occurrence of upper and lower vibrations.

The control method according to this invention has been invented in order to solve such problems with the conventional method.

Figure 4:
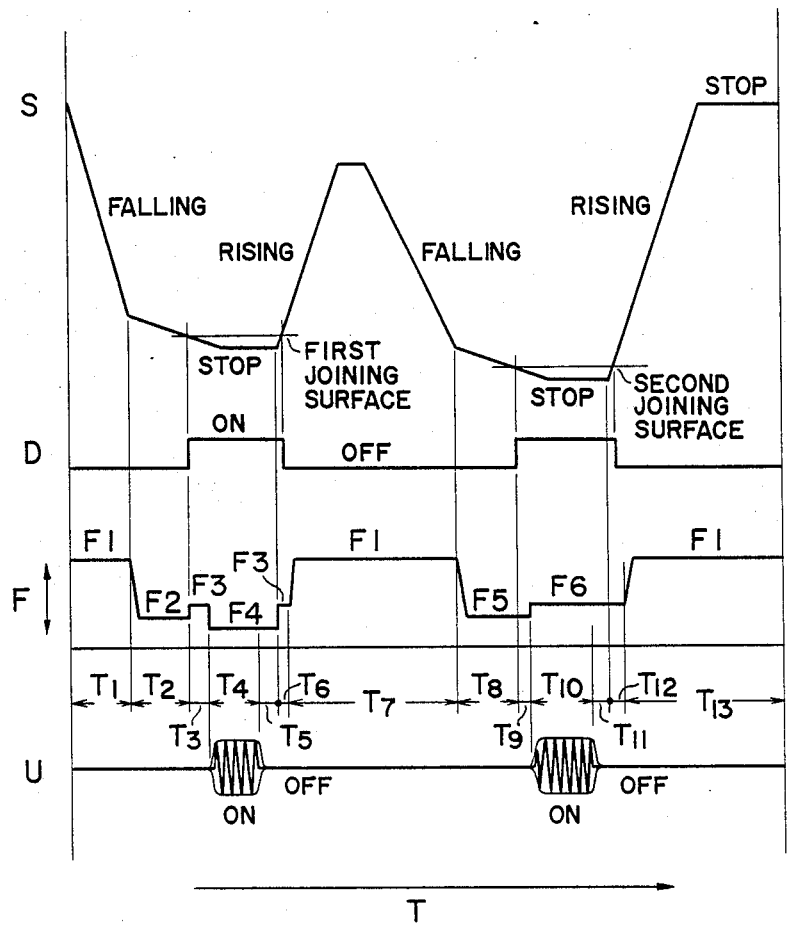
FIG. 4 is a time chart showing a method of controlling a wire bonding apparatus according to this invention.

The control method according to this invention will be explained with reference to the time chart in FIG. 4.

The feature of the control method according to this invention resides in that a control is conducted such that the driving force F of the voice coil motor 10 at the first bonding periods $T_2$ to $T_6$ and the second bonding periods $T_8$ to $T_{12}$ is changed.

First, at the time $T_1$ during which the bonding tool 7 lowers or falls at a high speed, a large driving force F1 is applied, thus allowing the sub-fluctuation arm 9 to follow the fluctuation arm 12. When the position S of the upper and lower movements of the bonding tool 7 is lowered to a predetermined height, the operational mode enters the approach time $T_2$, during which the bonding tool 7 will lower at a low speed. At this time, the driving force is set at a small value F2. It is to be noted that the driving force F is set to a value to such an extent that the bonding tool 7 operates stably and no vibration occurs without reducing the driving force F to the conventional one.

When the bonding tool 7 is further lowered and thus its lower end reaches the joining surface, so that the signal D of the surface sensor 20 is turned on, the driving force is increased to set it to a somewhat larger value F3. This is continued until the oscillation of ultrasonic wave is started. This time period will be referred to as delay time $T_3$ hereinafter. The abovementioned driving force F3 is determined to be a value such that the size of the wire tip portion is optimum for implementing ultrasonic bonding in consideration of the delay time $T_3$. Namely, when the wire is pressed onto the joining portion by the driving force F3, the tip portion thereof is collapsed or destroyed to an optimum size which is not too large or too small.

After the period $T_3$ has elapsed, the driving force is decreased to a value F4 which is a pressure force suitable for bonding or joining. Then, the transducer 5 is activated or operated through the US oscillation power source 21 to apply the ultrasonic wave U during the ultrasonic wave oscillation period $T_4$, thus completing the first wire bonding.

Taking into account the ultrasonic wave residual oscillation after the ultrasonic wave oscillation has been completed, the upward movement of the bonding tool 7 is started. At the time period $T_6$ immediately after the upward movement is started, the driving force F is maintained at a value F3 such that the bonding tool 7 does not vibrate. After the bonding tool has been raised to a predetermined height, the driving force for following the high speed operation is altered to a large driving force F1. Thus, the operational mode shifts to the next bonding or joining stage.

Where a driving force necessary for bonding is small, it is preferable for attainment of prevention of vibration to increase the driving force F once during the bonding period to move the bonding tool 7 upwardly.

After the high speed upward and downward movement period $T_7$, in the same manner as in the case of the first bonding, an approach period $T_8$ is provided to lower the bonding tool 7 to the joining portion at a low speed. The driving force at this time is set to F5 nearly equal to F2. Even at the delay time $T_9$ from the approach period $T_8$ to the time when the oscillation of the ultrasonic wave is started, the driving force is unchanged in the case of the second bonding. The driving force is increased to F6 so that it becomes equal to a pressure force suitable for joining or bonding after this period $T_9$ has elapsed. Then, by the US oscillation power source 21, ultrasonic wave is applied to the transducer 5. At the set time $T_{10}$ for ultrasonic wave oscillation, ultrasonic wave is applied, thus completing the second wire bonding.

Taking into consideration the ultrasonic wave residual oscillation after the ultrasonic wave oscillation has been completed, after the delay time $T_{11}$ has elapsed, the upward movement of the bonding tool 7 is started, thus maintaining the driving force at F6 during time periods $T_{11}$ to $T_{12}$. Since the bonding tool 7 is moved upwardly at a high speed at the subsequent period $T_{13}$, the driving force is changed to a large driving force F1 for allowing the bonding tool 7 to follow the high speed operation. Thus, the operational mode shifts to the next bonding or joining stage.

As just described above, in this embodiment, a control is effected such that the driving force F of the voice coil motor 10 at the first bonding periods $T_2$ to $T_6$ and the second bonding periods $T_8$ to $T_{12}$ is changed. Thus, an optimum bonding control can be performed.

While time is finely divided into $T_1$ to $T_{13}$ to set the driving force F to different values, respectively, in this embodiment, the driving force F may be set to the same value in part in the production of small kind. For example, the driving forces F2 and F3 at times $T_2$, $T_3$ and $T_6$ may be set to the same value. Thus, control is simplified.

In addition, in the production of wide variety and small quantity, there may be employed a method to accumulate know-how of respective set values in conformity with various conditions and evaluate the accumulated values to allow the CPU 22 to compute them, thereby to automatically determine suitable driving force set values with less set items.

It is to be noted that a capacitor may be disposed in the motor driver 19 of the voice coil motor 10, thus allowing the driving force to smoothly vary by making use of charge/discharge of the capacitor. In addition, without provision of such a capacitor, a control may be performed such that an output signal from the CPU 22 smoothly varies.

While reference has been made to the embodiment in which the control method according to this invention is applied to the wire bonding apparatus adapted to connect wires (wire materials) one by one, the control method according to this invention is not limited to such an implementation. For instance, the control method according to this invention may be applied to a bonding apparatus of the type which carries out a plurality of wirings at the same time.

What is claimed is:

1. A method of controlling a wire bonding apparatus comprising a drive motor, a main arm fluctuated by said drive motor, a sub-arm coupled to said main arm by coupling force given by a coupling motor, a bonding tool attached to said sub-arm, and ultrasonic wave application means for applying ultrasonic wave to said bonding tool, thus to apply ultrasonic wave to said bonding tool while bringing one end of a wire held by said bonding tool into contact with a joining portion of a semiconductor chip to thereby join or connect said wire to said joining portion, characterized in that:

said main arm and said sub-arm are coupled by a first coupling force given by said coupling motor for a time period during which the one end of said wire is not in contact with said joining portion of said semiconductor chip;

said main arm and said sub-arm are coupled by a second coupling force given by said coupling motor for a time period during which the one end of said wire is in contact with said joining portion of said semiconductor chip and ultrasonic wave is not applied to said bonding tool; and said main arm and said sub-arm are coupled by a third coupling force given by said coupling motor for a time period during which the one end of said wire is in contact with said joining portion of said semiconductor chip and ultrasonic wave is applied to said bonding tool.

2. A method of controlling a wire bonding apparatus as set forth in claim 1, wherein said first coupling force has such a strength to follow the movement of said main arm without allowing said bonding tool to vibrate even when said bonding tool is moved upwardly and downwardly through said main arm and said sub-arm by said drive motor.

3. A method of controlling a wire bonding apparatus as set forth in claim 1, wherein said second coupling force is a force such that the tip portion of said wire is in contact with said joining portion of said semiconductor chip in a predetermined area.

4. A method of controlling a wire bonding apparatus as set forth in claim 2, wherein said second coupling force is a force such that the tip portion of said wire is in contact with said joining portion of said semiconductor chip in a predetermined area.

5. A method of controlling a wire bonding apparatus as set forth in claim 1, wherein said third coupling force is such a force to apply pressure to said tip portion of said wire with a strength sufficient to join said tip portion of said wire to said joining portion of said semiconductor chip.

6. A method of controlling a wire bonding apparatus as set forth in claim 2, wherein said third coupling force is such a force to apply pressure to said tip portion of said wire with a strength sufficient to join said tip portion of said wire to said joining portion of said semiconductor chip.

7. A method of controlling a wire bonding apparatus as set forth in claim 3, wherein said third coupling force is such a force to apply pressure to said tip portion of said wire with a strength sufficient to join said tip portion of said wire to said joining portion of said semiconductor chip.

8. A method of controlling a wire bonding apparatus as set forth in claim 4, wherein said third coupling force is such a force to apply pressure to said tip portion of said wire with a strength sufficient to join said tip portion of said wire to said joining portion of said semiconductor chip.

9. A method of controlling a wire bonding apparatus as set forth in claim 1, wherein when said one end of said wire has reached within a predetermined distance from said joining portion of said semiconductor chip, said main arm and said sub-arm are coupled by a fourth coupling force different from said first coupling force given by said coupling motor in order not to give an impact to said joining portion of said semiconductor chip by said one end of said wire.

10. A method of controlling a wire bonding apparatus as set forth in claim 2, wherein when said one end of said wire has reached within a predetermined distance from said joining portion of said semiconductor chip, said main arm and said sub-arm are coupled by a fourth coupling force different from said first coupling force given by said coupling motor in order not to give an impact to said joining portion of said semiconductor chip by said one end of said wire.

11. A method of controlling a wire bonding apparatus as set forth in claim 3, wherein when said one end of said wire has reached within a predetermined distance from said joining portion of said semiconductor chip, said main arm and said sub-arm are coupled by a fourth coupling force different from said first coupling force given by said coupling motor in order not to give an impact to said joining portion of said semiconductor chip by said one end of said wire.

12. A method of controlling a wire bonding apparatus as set forth in claim 4, wherein when said one end of said wire has reached within a predetermined distance from said joining portion of said semiconductor chip, said main arm and said sub-arm are coupled by a fourth coupling force different from said first coupling force given by said coupling motor in order not to give an impact to said joining portion of said semiconductor chip by said one end of said wire.

13. A method of controlling a wire bonding apparatus as set forth in claim 5, wherein when said one end of said wire has reached within a predetermined distance from said joining portion of said semiconductor chip, said main arm and said sub-arm are coupled by a fourth coupling force different from said first coupling force given by said coupling motor in order not to give an impact to said joining portion of said semiconductor chip by said one end of said wire.

14. A method of controlling a wire bonding apparatus as set forth in claim 6, wherein when said one end of said wire has reached within a predetermined distance from said joining portion of said semiconductor chip, said main arm and said sub-arm are coupled by a fourth coupling force different from said first coupling force given by said coupling motor in order not to give an impact to said joining portion of said semiconductor chip by said one end of said wire.

15. A method of controlling a wire bonding apparatus as set forth in claim 7, wherein when said one end of said wire has reached within a predetermined distance from said joining portion of said semiconductor chip, said main arm and said sub-arm are coupled by a fourth coupling force different from said first coupling force given by said coupling motor in order not to give an impact to said joining portion of said semiconductor chip by said one end of said wire.

16. A method of controlling a wire bonding apparatus as set forth in claim 8, wherein when said one end of said wire has reached within a predetermined distance from said joining portion of said semiconductor chip, said main arm and said sub-arm are coupled by a fourth coupling force different from said first coupling force given by said coupling motor in order not to give an impact to said joining portion of said semiconductor chip by said one end of said wire.

* * * * *